(12) United States Patent
Krabe et al.

(10) Patent No.: US 9,425,175 B2
(45) Date of Patent: Aug. 23, 2016

(54) METHODS FOR PERFORMING EXTENDED WAFER-LEVEL PACKAGING (EWLP) AND EWLP DEVICES MADE BY THE METHODS

(71) Applicant: Avago Technologies General IP (Singapore) Pte. Ltd., Singapore (SG)

(72) Inventors: Detlef Bernd Krabe, Munich (DE); Josef Wittl, Parsberg (DE)

(73) Assignee: Avago Technologies General IP (Singapore) Pte. Ltd. (SG)

( * ) Notice: Subject to any disclaimer, the term of this patent is extended or adjusted under 35 U.S.C. 154(b) by 0 days.

(21) Appl. No.: 15/002,333

(22) Filed: Jan. 20, 2016

(65) Prior Publication Data

US 2016/0141279 A1    May 19, 2016

Related U.S. Application Data

(62) Division of application No. 14/213,342, filed on Mar. 14, 2014, now Pat. No. 9,305,908.

(51) Int. Cl.
| | |
|---|---|
| *H01L 25/16* | (2006.01) |
| *H01L 21/56* | (2006.01) |
| *H01L 31/02* | (2006.01) |
| *H01L 23/31* | (2006.01) |
| *H01L 31/167* | (2006.01) |
| *H01L 23/538* | (2006.01) |
| *H01S 5/022* | (2006.01) |

(52) U.S. Cl.
CPC ......... *H01L 25/167* (2013.01); *H01L 23/3114* (2013.01); *H01L 23/5386* (2013.01); *H01L 25/165* (2013.01); *H01L 31/02002* (2013.01); *H01L 31/167* (2013.01); *H01S 5/02248* (2013.01)

(58) Field of Classification Search
None
See application file for complete search history.

(56) References Cited

U.S. PATENT DOCUMENTS

| | | | |
|---|---|---|---|
| 4,711,997 A | 12/1987 | Miller | |
| 4,713,841 A | 12/1987 | Porter et al. | |
| 5,532,512 A | 7/1996 | Fillion et al. | |
| 7,048,450 B2 | 5/2006 | Beer et al. | |
| 7,170,049 B2 | 1/2007 | Iwanczyk et al. | |
| 7,486,847 B1 | 2/2009 | Dellmann et al. | |

(Continued)

FOREIGN PATENT DOCUMENTS

| | | |
|---|---|---|
| WO | 0002247 | 1/2000 |

OTHER PUBLICATIONS eWLB Embedded Wafer-Level Ball Grid Array, Aug. 2011, p. 1-2, STATS ChipPAC Ltd. Singapore.

(Continued)

*Primary Examiner* — Seahvosh Nikmanesh

(57) ABSTRACT

Embedded Wafer-Level Packaging (eWLP) devices, packages and assemblies and methods of making them are provided. The eWLP methods allow back side electrical and/or thermal connections to be easily and economically made at the eWLP wafer level without having to use thru-mold vias (TMVs) or thru-silicon vias (TSVs) to make such connections. In order to create TMVs, processes such as reactive ion etching or laser drilling followed metallization are needed, which present difficulties and increase costs. In addition, the eWLP methods allow electrical and optical interfaces to be easily and economically formed on the front side and/or on the back side of the eWLP wafer, which allows the eWLP methods to be used to form optoelectronic devices having a variety of useful configurations.

21 Claims, 19 Drawing Sheets

(56) References Cited

U.S. PATENT DOCUMENTS

| | | | |
|---|---|---|---|
| 7,536,066 B2 | 5/2009 | Kato et al. | |
| 7,863,088 B2 | 1/2011 | Brunnbauer et al. | |
| 8,064,739 B2 | 11/2011 | Binkert et al. | |
| 8,352,009 B2 | 1/2013 | Hoarau et al. | |
| 8,642,385 B2 | 2/2014 | Xue et al. | |
| 8,642,397 B1 | 2/2014 | Gong et al. | |
| 8,742,370 B2 | 6/2014 | Tkachuk | |
| 9,142,746 B2 | 9/2015 | Weigert | |
| 9,305,908 B2 * | 4/2016 | Krabe | H01L 25/167 |
| 2004/0057648 A1 | 3/2004 | Yunus | |
| 2004/0069997 A1 | 4/2004 | Dair et al. | |
| 2004/0217366 A1 | 11/2004 | Gale et al. | |
| 2004/0259282 A1 | 12/2004 | Oohata | |
| 2008/0122122 A1 | 5/2008 | Wong et al. | |
| 2008/0186702 A1 | 8/2008 | Camras et al. | |
| 2009/0166857 A1 | 7/2009 | Lee | |
| 2010/0061106 A1 | 3/2010 | Shyu et al. | |
| 2010/0316184 A1 | 12/2010 | Iwanczyk et al. | |
| 2011/0024916 A1 | 2/2011 | Marimuthu et al. | |
| 2011/0042798 A1 | 2/2011 | Pagaila et al. | |
| 2011/0095426 A1 | 4/2011 | Chang | |
| 2011/0193241 A1 | 8/2011 | Yen et al. | |
| 2011/0194265 A1 | 8/2011 | Su et al. | |
| 2012/0038044 A1 | 2/2012 | Chang et al. | |
| 2012/0220082 A1 | 8/2012 | Ng et al. | |
| 2013/0001795 A1 | 1/2013 | Lim et al. | |
| 2013/0075924 A1 | 3/2013 | Lin et al. | |
| 2013/0237774 A1 | 9/2013 | Schentag et al. | |
| 2013/0241077 A1 | 9/2013 | Fuergut et al. | |
| 2013/0264684 A1 | 10/2013 | Yu et al. | |
| 2013/0266255 A1 | 10/2013 | Tan et al. | |
| 2013/0320471 A1 | 12/2013 | Luan | |
| 2015/0118770 A1 | 4/2015 | Krabe et al. | |

OTHER PUBLICATIONS

Wafer Level Chip Scale Package (WLCSP), Freescale Semiconductor Application Note, Aug. 2009, 16 pages, AN3846, Rev 2.0.

Kitronik Ltd., "Kitronik Ltd—5mm RGB LED Common Anode", Technology Data Sheet & Specifications, http://www.kitronic.co.uk, 3 pages.

Siliconcore Technology, "SiliconCore LED Display Products", www.silicon-core.com, SiliconCore Technology, Inc., Jan. 4, 2013, 53 pages.

THINGM Labs, "BLINKM Datasheet", blinkm.thingm.com, v20100810, THINGM Labs, 50 pages.

W.R. Bottoms & William T. Chen, "A Description of What Will Specifically Be Needed to Support the Continuation of the Rapid Pace of Progress Achieved by the Electronics Industry", ITRS Chapter: Assembly & Packaging, Future Fab International Issue 40, Jan. 12, 2012, Future Fab International, http://www.future-fab.com.

"Renesas to Commercialize FO-WLP Technology in MCU Product Line by 2011", Micronews, Advanced Packaging, Oct. 10, 2010, http://renesas.com.

William Henry, "MicroLEDs Enabling New Generation of Fluorescence Instruments", BioPhotonics, www.photonics.com, 2014, 5 pages.

Artur Dybko, "Fiber Optic Chemical Sensors", Chemical Sensors Research Group, 2005, 9 pages, http://csrg.ch.pw.edu.pl/tutorials/fiber.

Machine translation of WO0002247, published Jul. 6, 1999.

Garrou, P. "IFTLE 29 IEEE 3D IC Test Workshop Part 2", Solid State Technology [online]. Dec. 22, 2010. [retrieved on Jun. 27, 2013], 127 pages. Retrieved from the Internet: <URL: http://www.electroiq.com/blogs/insights_from_leading_edge/2010.htm>.

Souriau, J., et al. "Wafer Level Processing of 3D System in Package for RF and Data Applications." IEEE 2005 Electronic Components and Technology Conference, pp. 356-361.

Do-Won Kim et al. "High Efficiency and Stable Optical Transmitter Using VCSEL-direct-bonded Connector for Optical Interconnection", Nov. 13, 2007, 9 pages.

Paniccia, Mario, "The Silicon Solution", Oct. 1, 2005, 8 pages.

* cited by examiner

METHODS FOR PERFORMING EXTENDED WAFER-LEVEL PACKAGING (EWLP) AND EWLP DEVICES MADE BY THE METHODS

TECHNICAL FIELD OF THE INVENTION

The invention relates to embedded Wafer-Level Packaging (eWLP) technology, and more particularly, to eWLP methods and eWLP devices made by the method.

BACKGROUND OF THE INVENTION eWLP technology is a semiconductor device packaging technology in which a multiplicity of device packages having semiconductor dies or chips embedded therein are co-formed with one another as part of a single "wafer" of moldable material and then transformed into individual packages by dicing or singulating the wafer. The process of forming eWLP packages commonly begins with mounting a multiplicity of semiconductor dies on an adhesive tape base. A robotic pick-and-place machine is commonly employed in the mounting step. Next, a layer of molding compound, such as a liquid polymer, is applied to the dies and to the adhesive tape base, thereby embedding, or potting, the dies within the molding compound. The molding compound is then cured to harden it. The resulting assembly is analogous to a wafer of the type traditionally employed in semiconductor fabrication in that the assembly is singulated in a later step of the process. For this reason, such an eWLP assembly is sometimes referred to as a wafer.

The tape base is removed from the assembly, exposing the front side of the assembly. The molding compound surface on the back side of the assembly is ground down until the assembly has a target thickness. Next, a metal layer is applied to one or both surfaces of the assembly by, for example, metal sputtering or electro-plating. Each metal layer is then photolithographically patterned to form a redistribution layer (RDL) that defines electrical signal paths. In some types of eWLP processes, arrays of solder balls are formed on the RDL. The assembly is then diced into individual eWLP packages, each containing one or more semiconductor chips.

Optoelectronic devices or modules having eWLP packages are known. Optoelectronic modules, such as optical transmitter and receiver modules, for example, are used in optical communications systems and sensor systems. In the case of an optical communications system, an optical transmitter can convert electrical signals that are modulated with information into optical signals for transmission over an optical fiber. An optoelectronic light source, such as a laser diode, performs the electrical-to-optical signal conversion in the optical transmitter. An optical receiver can receive the optical signals transmitted over the optical fiber and recover the information by demodulating the optical signals. An optoelectronic light detector, such as a photodiode, performs the optical-to-electrical signal conversion in the optical receiver. The functions of optoelectronic modules in sensor systems are very similar, with an emitting device (e.g., a laser diode) performing the electrical-to-optical conversion and a receiving device (e.g., a photodiode) performing the optical-to-electrical conversion. Additional integrated circuits (ICs) might be included in the eWLP package for controlling the system or processing data and signals in the system.

The optoelectronic light sources, receivers and/or ICs incorporated into the eWLP packages have front side and/or back side contacts on them. The front side contacts become accessible when the adhesive tape is removed from the front side of the wafer. Any back side contacts, however, are typically encapsulated within the hardened molding compound, and therefore are not easily accessible. One way to access the back side contacts is to form thru-silicon vias (TSVs) or thru-mold vias (TMVs) in the bulk material of the chips or in the mold material, respectively, to create electrical pathways from the front side of the wafer to the back side of the wafer. Electrical connections (e.g., bond wires) may then be used to connect the ends of the vias disposed on the back side of the wafer to electrical contacts disposed on the back sides of the chips. The manner in which such connections are made within the wafer affects manufacturing economy.

Accordingly, it would be desirable to provide eWLP methods that allow back side electrical and/or thermal connections to be easily and economically made.

DETAILED DESCRIPTION

Figure 1A:
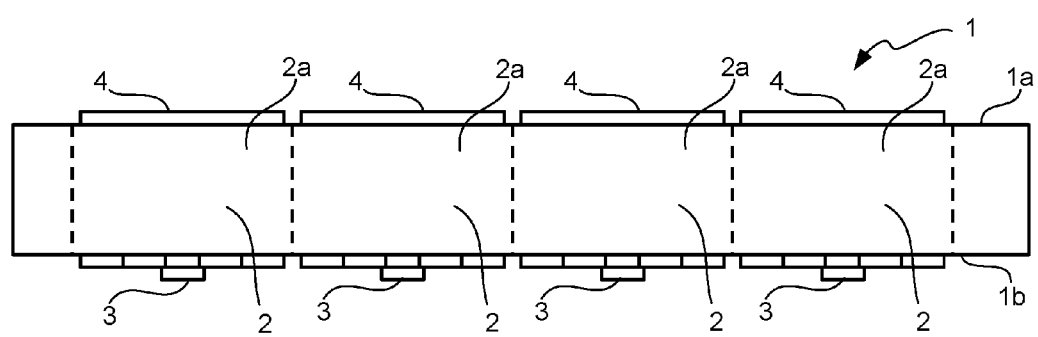
FIG. 1A illustrates a side cross-sectional view of a semiconductor wafer having a plurality of optoelectronic chips formed therein.

In accordance with the invention, eWLP methods are provided that allow back side electrical and/or thermal connections to be easily and economically made at the eWLP wafer level without having to use TMVs or TSVs to make such connections. In addition, the eWLP methods allow electrical and optical interfaces to be easily and economically formed on the front side and/or on the back side of the eWLP wafer, which allows the eWLP methods to be used to form optoelectronic devices having a variety of useful configurations. Illustrative embodiments of the eWLP methods will first be described with reference to FIGS. 1A-5, and then a variety of eWLP optoelectronic devices, packages and assemblies that may be made by the eWLP methods will be described with reference to FIGS. 6-9. Like reference numerals in the figures represent like elements, features or components. Elements, features or components in the figures are not drawn to scale and are not intended to be dimensionally accurate.

FIG. 1A illustrates a side cross-sectional view of a semiconductor wafer 1 having a plurality of optoelectronic chips 2 formed therein. The wafer 1 has a frontside 1a and a backside 1b. A plurality of electrically-conductive functional structures 3 are formed on the front side 1a of the wafer 1 during known wafer-level processes. The functional structures 3 may be any type of structures, but are typically electrical contacts for providing electrical pathways to electrical contact pads (not shown) formed in the respective chips 2. Each chip 2 has a bulk 2a, which is the primary material of which the chip 2 is made. The bulk 2a may be made of any type of material, such as a semiconductive material, a conductive material, an insulative material, or any combination thereof. Although the wafer 1 shown in FIG. 1A is referred to herein as a semiconductor wafer, this terminology is intended to denote that the wafer 1 is formed using known semiconductor, or microelectronic, fabrication processes rather than to denote the type of bulk material of which the wafer 1 is made. In accordance with this illustrative embodiment, a metallization layer 4 is formed on the backside 1b of the wafer 1 by known wafer-level processes, e.g., sputtering, vapor deposition, etc. The metallization layer 4 is not needed in all cases, as will be described below in more detail with reference to FIG. 6.

Figure 1B:
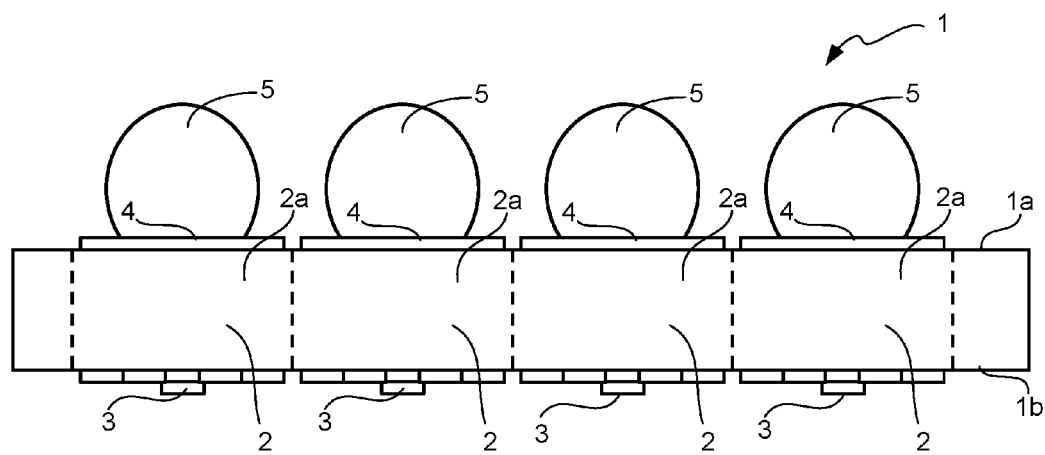
FIG. 1B illustrates a side cross-sectional view of the wafer shown in FIG. 1A having respective backside contact elements disposed on the metallization layer of each chip.

FIG. 1B illustrates a side cross-sectional view of the wafer 1 shown in FIG. 1A having respective backside contact elements 5 disposed on the metallization layer 4 of each chip 2. The contact elements 5 may comprise any type of electrically-conductive or electrically-semiconductive material, but typically comprise an electrically-conductive material such as solder metal alloy, but may instead be a ceramic element and/or a polymer element. If metal is used for the contact elements 5, the contact elements 5 may be, for example: solder bumps that are attached to the metallization layer 4 by a solder reflow process; solder bumps that are formed by applying a solder paste to the metallization layer 4 and then subsequently heating the solder paste in a thermal reflow step; a metal part that is glued to the metallization layer 4; and a metal part that is bonded to the metallization layer 4 by a thermo-compression bonding process. If a ceramic material or glass is used for the contact elements 5, the contact elements may be, for example: a ceramic part that is soldered to the metallization layer 4; glass that is applied to the metallization layer 4 as a glass frit that is applied to the metallization layer 4 and then subjected to an annealing process; a ceramic part that is glued to the metallization layer 4; and a ceramic part that is bonded to the metallization layer 4 by a thermo-compression molding process. For illustrative purposes, the contact elements 5 are shown as being solder bumps. If a polymeric part is used for the contact elements 5, the contact elements may be, for example: a polymeric part that is soldered to the metallization layer 4; a polymeric part that is applied to the metallization layer 4 and then subjected to a thermal cure process to form polymer bumps; a polymeric part that is glued to the metallization layer 4; and a polymeric part that is bonded to the metallization layer 4 by a thermo-compression molding process. For illustrative purposes, the contact elements 5 are shown as being solder bumps.

Figure 1C:
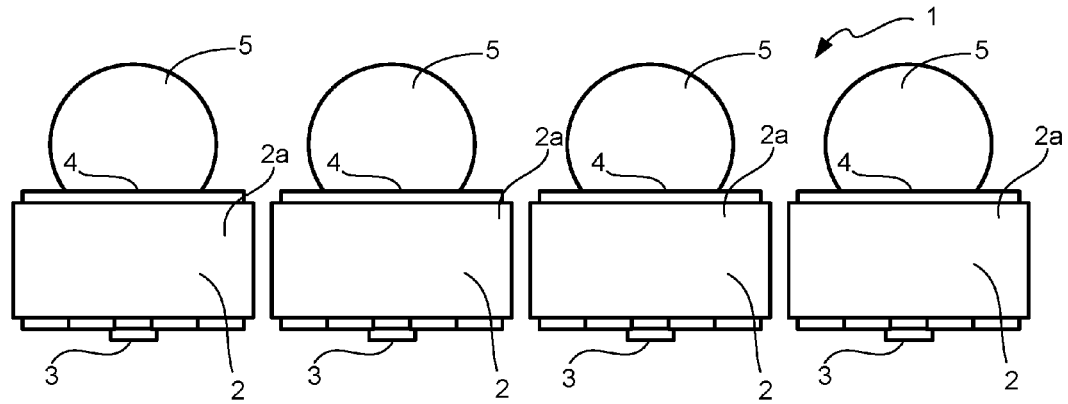
FIG. 1C illustrates a side cross-sectional view of the wafer shown in FIG. 1B after the wafer has been diced, or singulated, to separate the chips from one another.
Figure 2A:
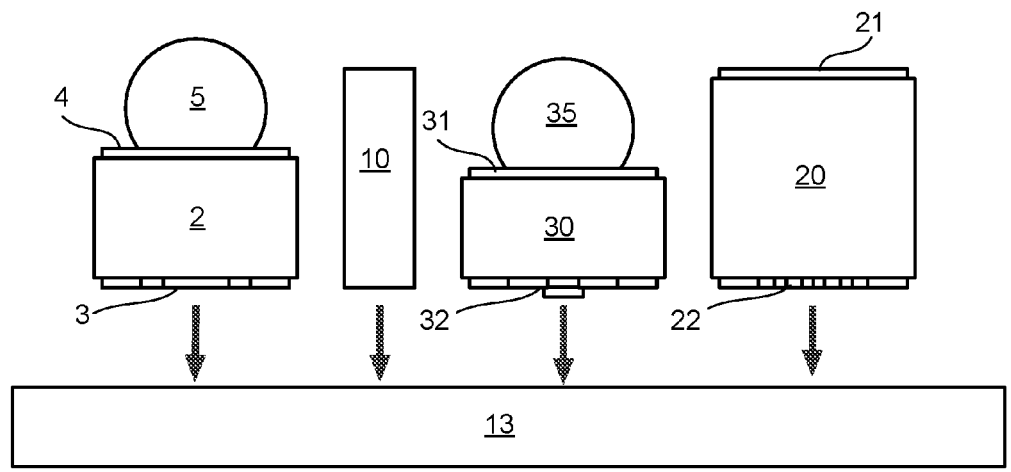
FIG. 2A illustrates a cross-sectional view of one of the chips shown in FIGS. 1A-1C, two other chips, and a bulk component as they are all being mounted on an adhesive tape base.

FIG. 1C illustrates a side cross-sectional view of the wafer 1 shown in FIG. 1B after the wafer 1 has been diced, or singulated, to separate the chips 2 from one another. After the chips 2 have been singulated from one another, the chips 2 are used in combination with other components to form an artificial wafer, as will now be described with reference to FIGS. 2A-2H. A known pick-and-place machine (not shown) is used to place one or more of the chips 2 shown in FIGS. 1A-1C and one or more other chips and one or more various other components at precise locations on an adhesive tape base. FIG. 2A illustrates a cross-sectional view of one of the chips 2 shown in FIGS. 1A-1C, two other chips 20 and 30, and a bulk component 10 as they are all being mounted on an adhesive tape base 13. The adhesive tape base 13 forms the base of the artificial wafer. In accordance with this embodiment, component 10 is a block of bulk material having a known electrical conductivity and chips 20 and 30 are different types of chips that have been formed on respective semiconductor wafers (not shown) and singulated therefrom. Chips 20 and 30 are also different in type from chip 2. All of the chips 2, 20 and 30 have been formed on respective wafers (not shown) by known microelectronic chip fabrication processes.

In accordance with this illustrative embodiment, chips 20 and 30 have metallization layers 21 and 31 that were previously formed on the back side thereof by known wafer-level metallization processes. A plurality of electrically-conductive functional structures 22 and 32 were previously formed on the front side of the chips 20 and 30, respectively, by one or more known wafer-level processes prior to the chips 20 and 30. The functional structures 22 and 32 may be any type of structures, but are typically electrical contacts that provide electrical pathways from the front sides of the chips to electrical circuitry (not shown) located inside of the chips 20 and 30. Chip 30 has a contact element 35 disposed on the metallization layer 31 that may be identical to the contact element 5 disposed on the metallization layer 4 of chip 2.

Figure 2B:
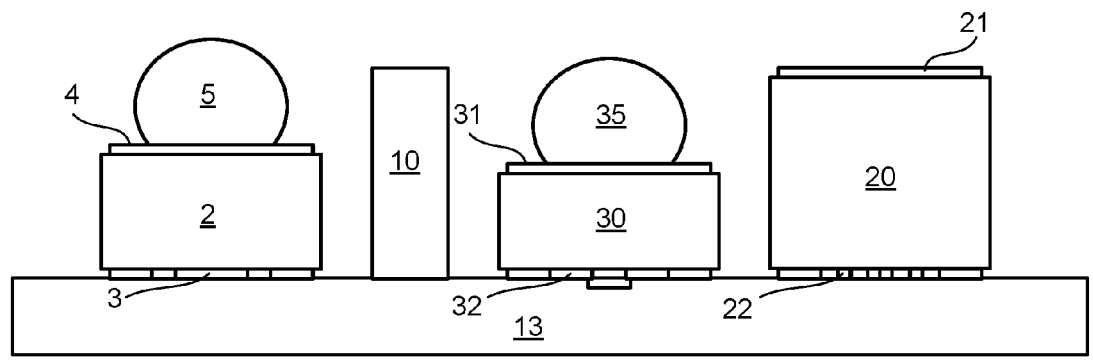
FIG. 2B illustrates a cross-sectional view of the chips and the block of bulk material shown in FIG. 2A after they have been mounted on the adhesive tape base.
Figure 2C:
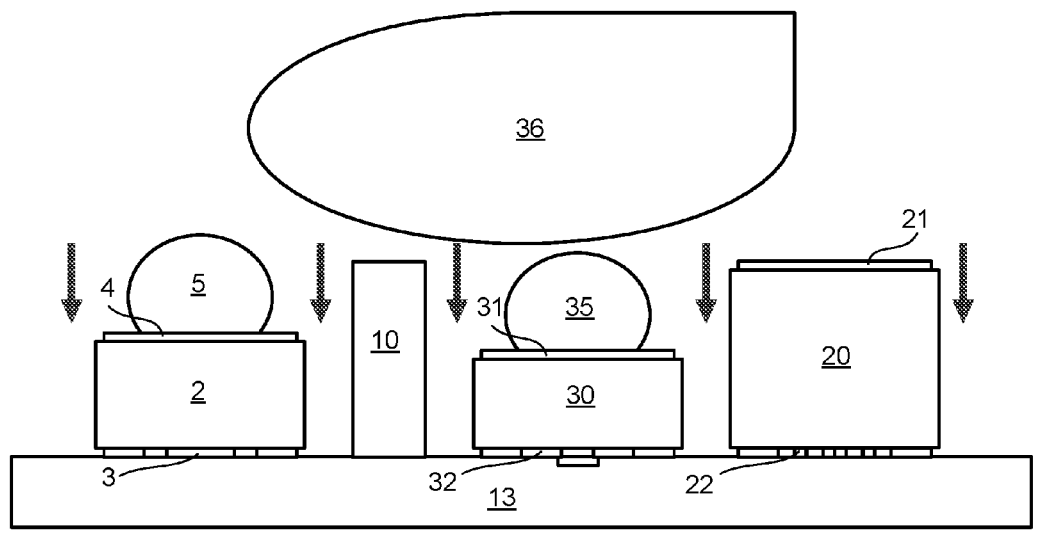
FIG. 2C illustrates a cross-sectional view of the chips and the block of bulk material mounted on the adhesive tape base as shown in FIG. 2B as a mold compound is being poured over the tape base, the chips and the block of bulk material.
Figure 2D:
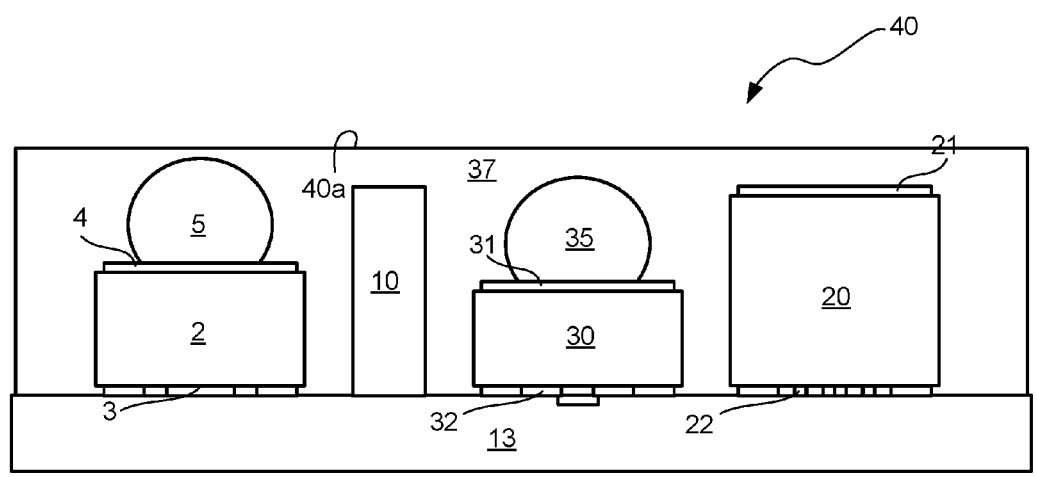
FIG. 2D illustrates a cross-sectional view of the chips and the block of bulk material shown in FIG. 2C encapsulated in the cured mold material forming an artificial eWLP wafer.

FIG. 2B illustrates a cross-sectional view of the chips 2, 20 and 30 and the block of bulk material 10 after they have been mounted on the adhesive tape base 13. FIG. 2C illustrates a cross-sectional view of the chips 2, 20 and 30, and the block of bulk material 10 mounted on the adhesive tape base 13 as a mold compound 36 is being poured over the tape base 13, the chips 2, 20, 30 and the block of bulk material 10. The mold compound 36 is poured into a mold (not shown) and cured to cause it to harden. FIG. 2D illustrates a cross-sectional view of the chips 2 and 20 and the block of bulk material 10 encapsulated in the cured mold material 37, which is in contact with portions of the adhesive tape base 13 in between the areas where the chips 2, 20, 30 and the block of bulk material 10 are in contact with the adhesive tape base 13. The configuration shown in FIG. 2D represents the eWLP artificial wafer 40.

It should be noted that although the contact elements 5 and 35 have been shown and described as being placed on the metallization layers 4 and 31, respectively, before the pick-and-place machine places the chips 2 and 30, respectively, on the adhesive tape base 13, the contact elements 5 and 35 may instead be placed on the metallization layers 4 and 31 after the chips 2 and 30, respectively, have been placed on the adhesive tape base 13.

Figure 2E:
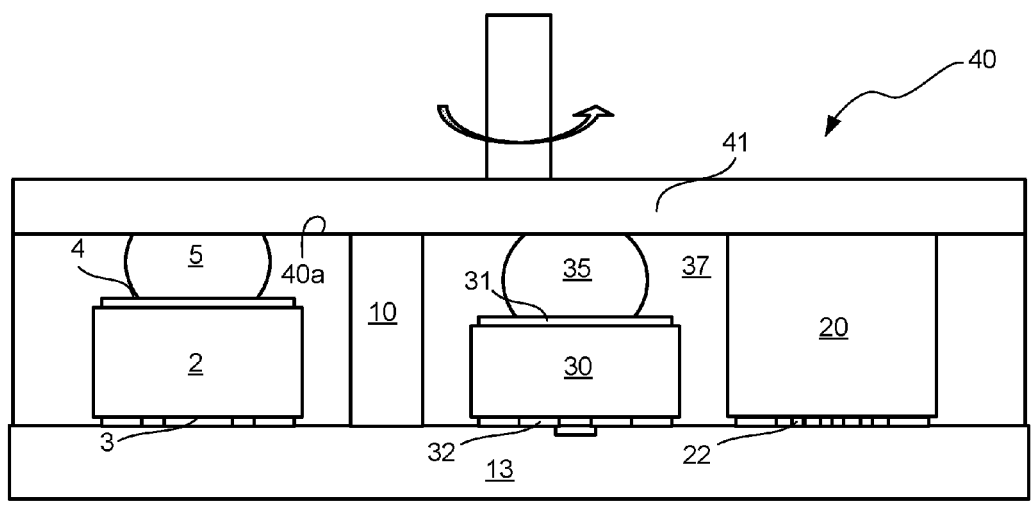
FIG. 2E illustrates a cross-sectional view of the artificial wafer shown in FIG. 2D being subjected to a down-grinding process.
Figure 2F:
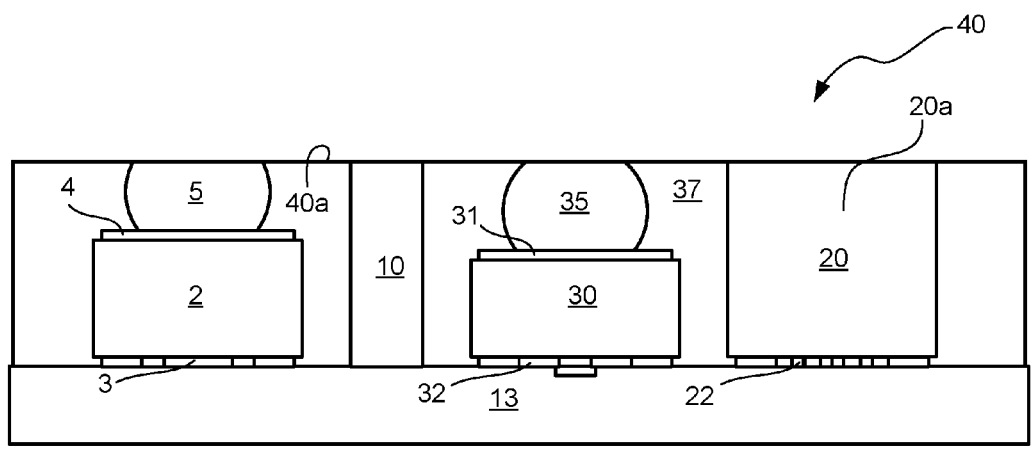
FIG. 2F illustrates a cross-sectional view of the artificial wafer shown in FIG. 2E after it has been ground down to expose portions of the contact elements, the interior of the bulk material block and the bulk material of one of the chips.

FIG. 2E illustrates a cross-sectional view of the artificial wafer 40 being subjected to the down-grinding process. After the eWLP artificial wafer 40 has been formed, a down-grinding device 41 is used to perform a down-grinding operation that grinds down the top surface 40a of the artificial wafer 40 until the wafer 40 has a particular, or desired, thickness. The manner in which such down-grinding operations are performed to thin wafers to a desired thickness is well known. In accordance with this illustrative embodiment, the artificial wafer 40 is ground down to expose portions of the contact elements 5, 35 the interior of the bulk material block 10 and the bulk material 20a of the chip 20 below the metallization layer 21. FIG. 2F illustrates a cross-sectional view of the artificial wafer 40 after it has been ground down to expose portions of the contact elements 5, 35, the interior of the bulk material block 10 and the bulk material 20a of the chip 20.

As will be described below in more detail, in accordance with this illustrative embodiment, the block of bulk material 10 and the bulk material 20a of chip 20 will be used to provide electrically-conductive pathways from the front side of the eWLP wafer 40 to the back side of the eWLP wafer 40. The contact elements 5, 35 are used to provide electrically-conductive pathways from the back side of the eWLP wafer 40 to the metallization layers 4 and 31, respectively. Providing all of these electrically-conductive pathways eliminates the need to form TMVs or TSVs in the mold material 37 or in the chips 2, 20 and 30 in order to provide electrically-conductive pathways from the front side to the back side of the eWLP wafer. Also, by forming these electrically-conductive pathways between the front side and the back side of the wafer 40, other process such as galvanic growth processes and electroplating processes that are sometimes used to provide electrically-conductive contact areas on the back side of an eWLP wafer are avoided. Such processes typically use copper or nickel as the electrically-conductive material. Grinding down copper or nickel produces copper or nickel particles that contaminate the eWLP wafer fabrication process. By avoiding the use of such processes and materials, the back side electrical connections are made safely and economically at the eWLP wafer-level without risking contamination of the eWLP wafer fabrication process.

Figure 2G:
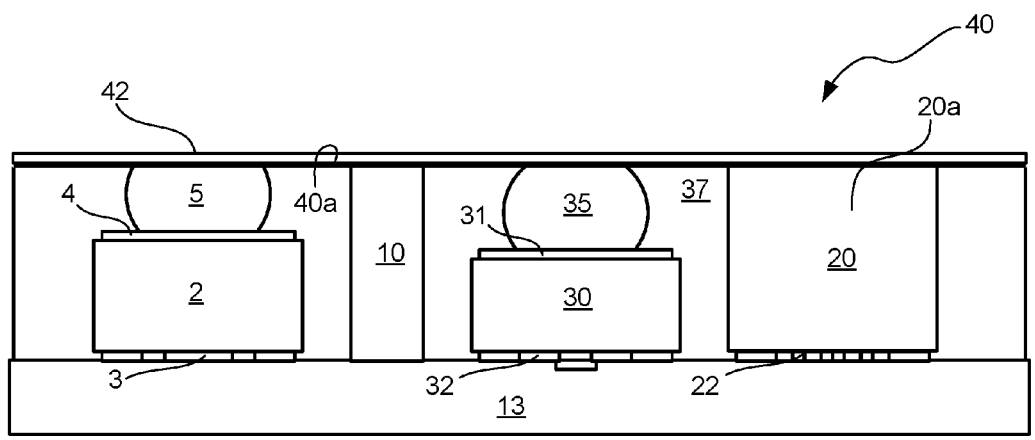
FIG. 2G illustrates a cross-sectional view of the artificial wafer shown in FIG. 2F being subjected to a metal deposition process.
Figure 2H:
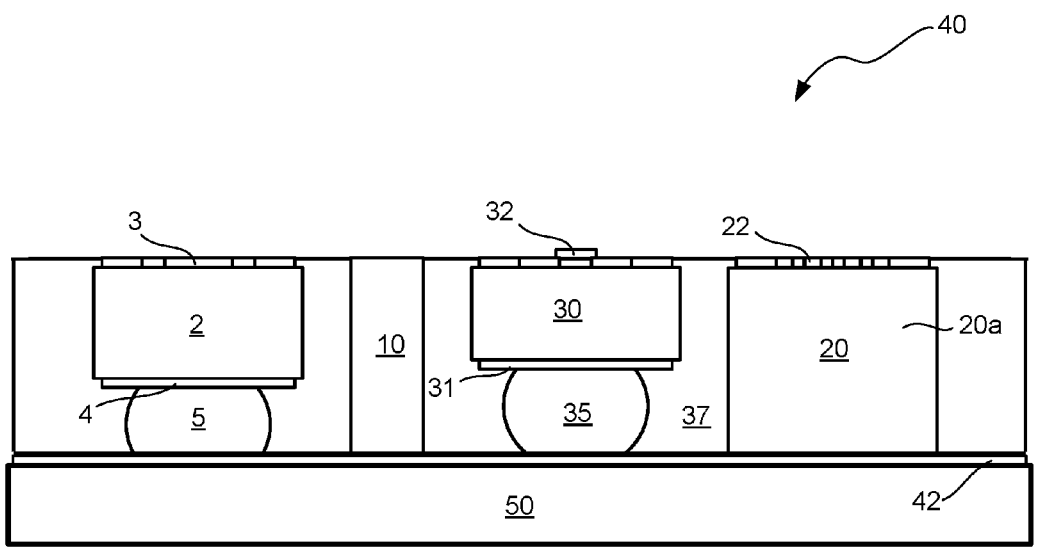
FIG. 2H illustrates a cross-sectional view of the eWLP wafer shown in FIG. 2G after the adhesive tape base has been removed, the wafer has been flipped, and the wafer has been mounted on a second adhesive tape base.

FIG. 2G illustrates a cross-sectional view of the artificial wafer 40 being subjected to a metal deposition process. By the metal deposition process, a metal layer 42 is formed on the top surface 40a of the eWLP wafer 40. The metal layer 40 is in contact with the contact elements 5, 35, with the block of bulk material 10 and with the bulk material 20a of the chip 20. After formation of the metal layer 42, the adhesive tape base 13 is removed. FIG. 2H illustrates a cross-sectional view of the eWLP wafer 40 shown in FIG. 2G after the adhesive tape base 13 has been removed, the wafer 40 has been flipped, and the wafer 40 has been mounted on a second adhesive tape base 50 such that the metal layer 42 is in contact with the adhesive tape base 50. In other words, the back side of the wafer 40 is now in contact with the adhesive tape base 50 and the front side is exposed.

Figure 2I:
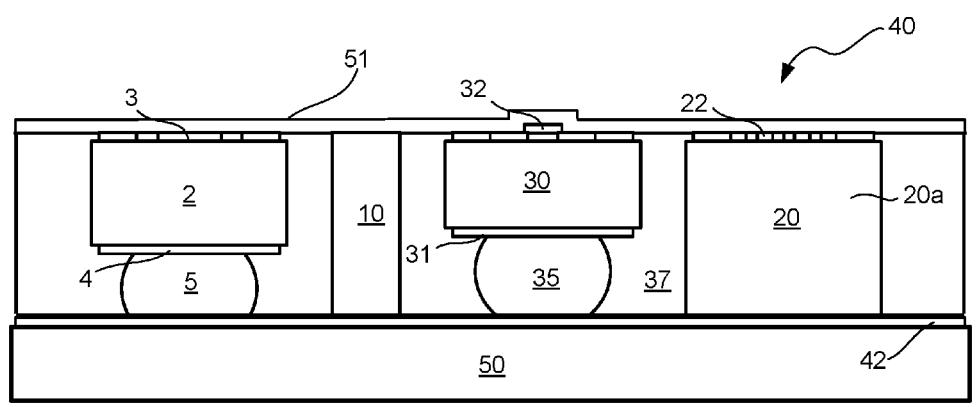
FIG. 2I illustrates a cross-sectional view of the eWLP wafer shown in FIG. 2H after the front side of the wafer has been subjected to a metal deposition process to form a metal layer on the front side of the wafer.
Figure 2J:
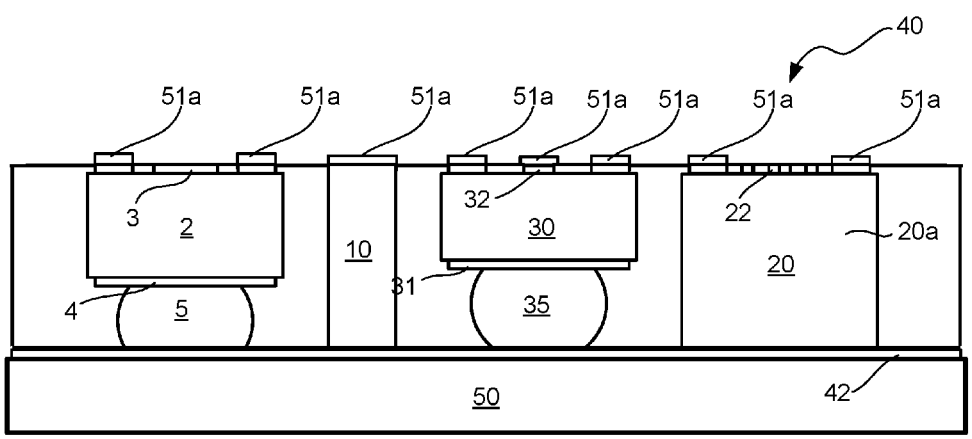
FIG. 2J illustrates a cross-sectional view of the eWLP wafer shown in FIG. 2I with the remaining portions of the metal layer disposed on the functional structures of the chips.
Figure 2K:
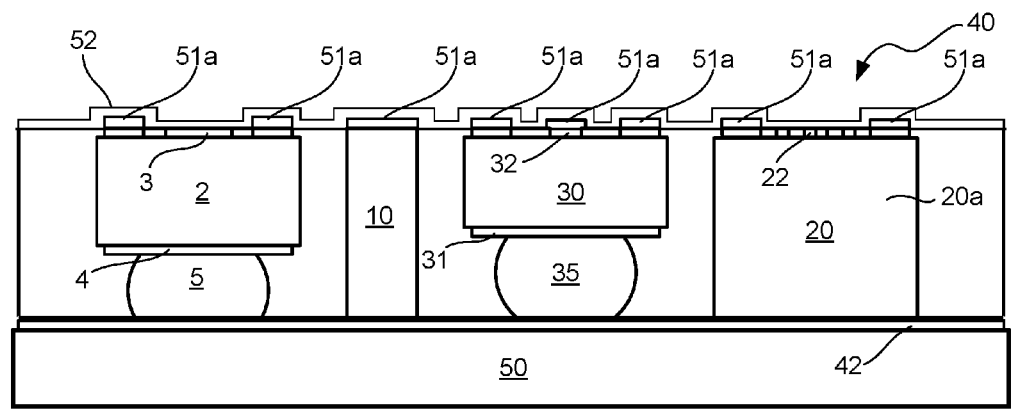
FIG. 2K illustrates a cross-sectional view of the eWLP wafer shown in FIG. 2J with the structured metal layer covered with a layer of dielectric material.
Figure 2L:
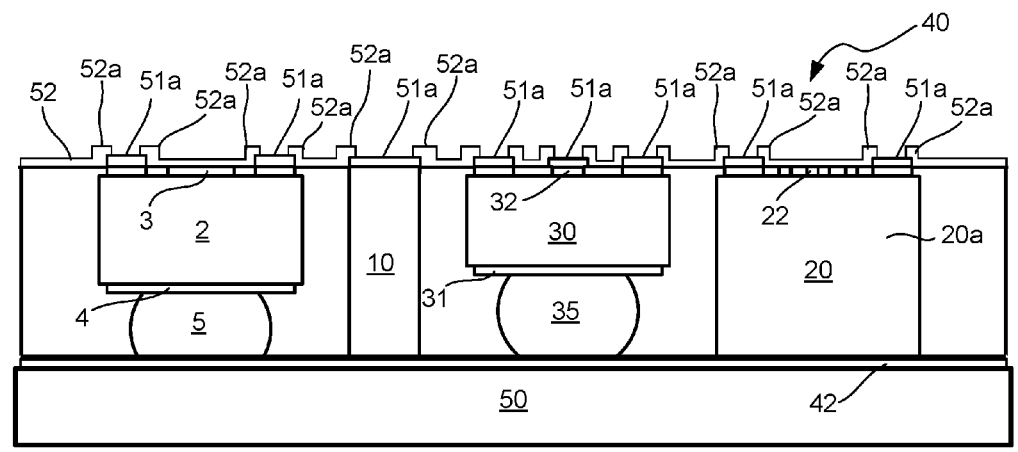
FIG. 2L illustrates a cross-sectional view of the eWLP wafer shown in FIG. 2K after the dielectric layer has been structured, or patterned, to form patterned dielectric layer.

FIG. 2I illustrates a cross-sectional view of the eWLP wafer 40 shown in FIG. 2H after the front side of the wafer 40 has been subjected to a metal deposition process to form a metal layer 51 on the front side of the wafer 40. The metal layer 51 covers the electrically-conductive functional structures 3, 22 and 32. After the metal layer 51 is been put down, it is structured, or patterned, using known metal structuring processes (e.g., masking and etching). FIG. 2J illustrates a cross-sectional view of the eWLP wafer 40 shown in FIG. 2I with the remaining portions 51a of the metal layer 51 disposed on the functional structures 3, 22 and 32. FIG. 2K illustrates a cross-sectional view of the eWLP wafer 40 shown in FIG. 2J with the structured metal layer 51a covered with a layer of dielectric material 52. FIG. 2L illustrates a cross-sectional view of the eWLP wafer 40 shown in FIG. 2K after the dielectric layer 52 has been structured, or patterned, to form patterned dielectric layer 52a. Known photolithographic processes are used to pattern the dielectric layer 52. The patterned dielectric layer 52a provides dielectric features that insulate the metal portions 51a from adjacent metal portions 51a.

Figure 2M:
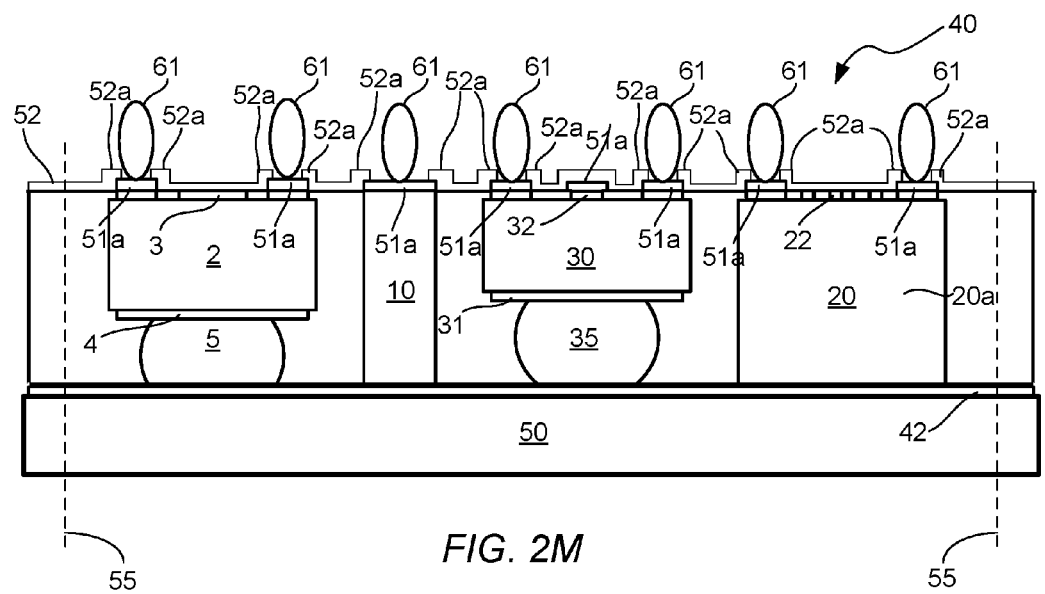
FIG. 2M illustrates a cross-sectional view of the eWLP wafer shown in FIG. 2L after contact elements have been placed on portions of the metal layer.
Figure 2N:
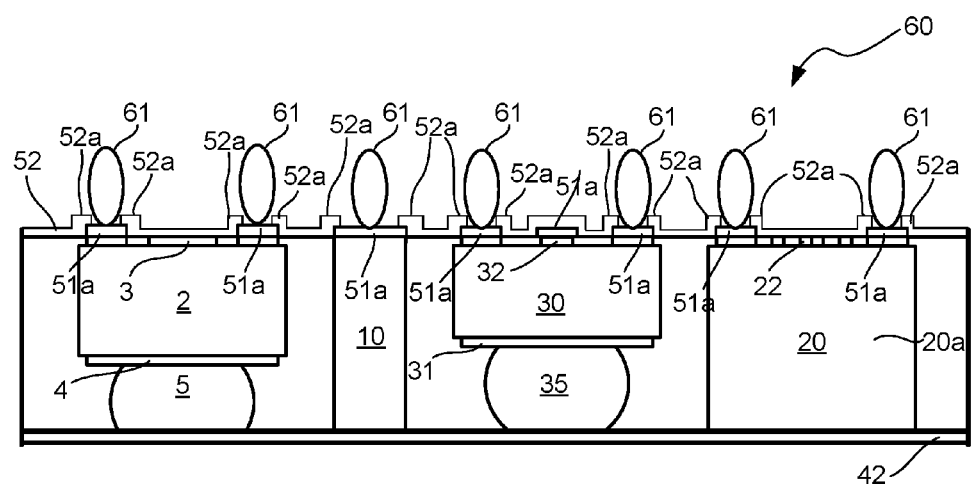
FIG. 2N illustrates a cross-sectional view of the singulated eWLP package that results from performing a dicing operation.

After the dielectric layer 52 has been patterned, as shown in FIG. 2L, electrically-conductive contact elements 61 are placed on the metal portions 51a of metal layer 51, as shown in FIG. 2M, which illustrates a cross-sectional view of the eWLP wafer 40 shown in FIG. 2L after the contact elements 61 have been placed on the portions 51a of the metal layer 51. After the EWLP wafer 40 has been fabricated by the process described above with reference to FIGS. 2A-2M, a singulation process is performed to singulate the eWLP package shown in FIG. 2M from the other eWLP packages formed in the same wafer 40. Although only one package is shown in FIG. 2M, there will typically be many such packages formed in a single eWLP wafer. The dashed lines 55 in FIG. 2M represent the dicing locations at which the wafer 40 is sawed. FIG. 2N illustrates a cross-sectional view of the singulated eWLP package 60 that results from performing the dicing operation represented by the dashed lines 55. After the dicing operation has been performed, the second adhesive tape base 50 is removed, resulting in the finished eWLP package 60 shown in FIG. 2N. Although the package 60 shown in FIG. 2N may considered finished, or completed, further processing of the package 60 may occur if further processing is needed or desired to add additional features, components or elements.

Figure 3:
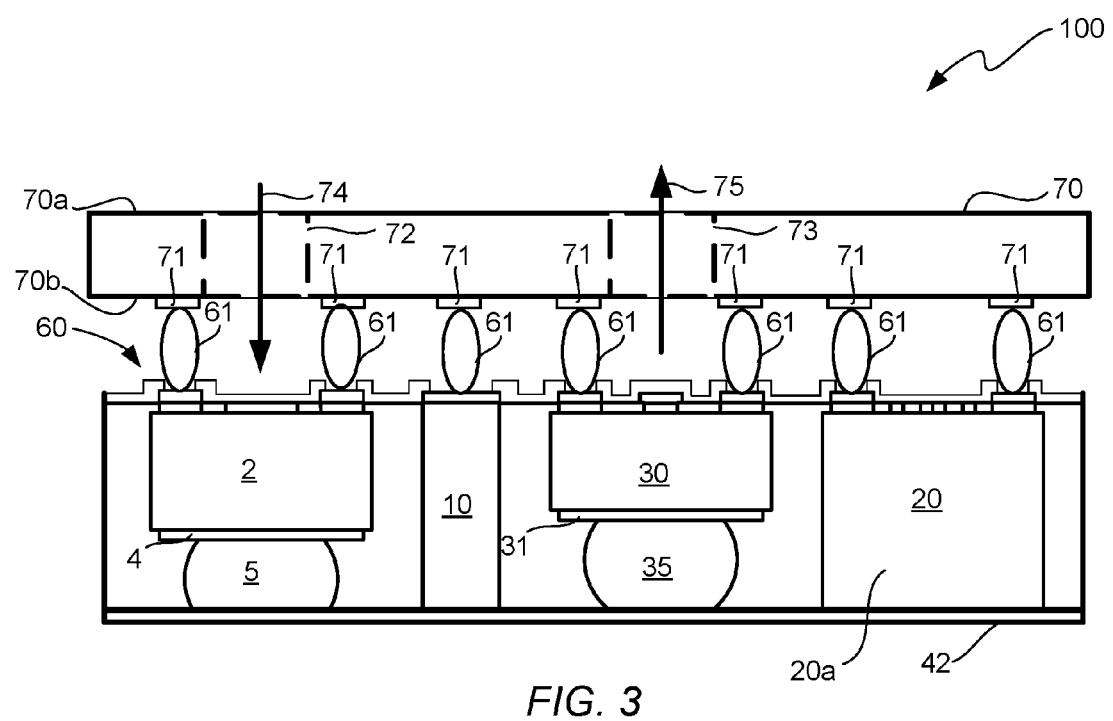
FIG. 3 illustrates a cross-sectional view of an eWLP assembly comprising the eWLP package shown in FIG. 2N electrically connected to a PCB.

FIG. 3 illustrates a cross-sectional view of an eWLP assembly 100 comprising the eWLP package 60 shown in FIG. 2N electrically connected to a PCB 70. The eWLP package 60 is electrically connected to the PCB 70 via the contact elements 61 of the package 60 being placed in contact with respective electrically-conductive contact elements 71 of the PCB 70. Other mechanisms (not shown) may be used to mechanically couple the PCB 70 with the package 60 and to provide mechanical stability for the assembly 100. Optical windows 72 and 73 are formed in the PCB 70 that pass from a top side 70a of the PCB 70 to a bottom side 70b of the PCB 70. In accordance with this illustrative embodiment, the chip 2 is an optoelectronic receiver chip, such as, for example, a photodiode chip, and the chip 30 is an optoelectronic transmitter chip, such as, for example, a light emitting diode (LED) or laser diode chip. Thus, in accordance with this illustrative embodiment, the arrow 74 represents light passing through the window 72 and impinging on a light-receiving area of the chip 2 and the arrow 75 represents light emitted from the chip 30 and passing through the window 73. Thus, the windows 72 and 73 are transparent to operating wavelengths of the chips 2 and 30, respectively. The chip 20 may be, for example, a receiver chip for processing electrical sense signals produced by the chip 2, a laser diode driver chip for producing electrical drive signals that drive the chip 30, or a combination of the two.

It can be seen from FIG. 3 that the eWLP assembly 100 has an optical interface and an electrical interface with the PCB 70 that are on the same side of the eWLP package 60. If desired or needed, electrical contact between the PCB 70 and the back side of the eWLB package 60 and any electrical contacts (not shown) located on the back sides of the chips 2 and 30 may be made via contact elements 61 and 71, bulk material block 10, the metal layer 42 disposed on the back side of the eWLP package 60, and the contact elements 5 and 35, respectively. As indicated above, the bulk material of the block 10 has an electrical conductivity that is sufficiently high to allow it to be used as an electrical pathway. The bulk material 20a of chip 20 may also have an electrical conductivity that is sufficiently high to allow it to be used as an electrical pathway. In addition, further processing of the eWLP package 60 can be performed to form a redistribution layer in the metal layer 42 to further facilitate electrically interfacing the chips 2, 20 and 30 to other devices (not shown). The manner in which such redistribution layers are formed is well known and therefore will not be further described herein in the interest of brevity.

Figure 4A:
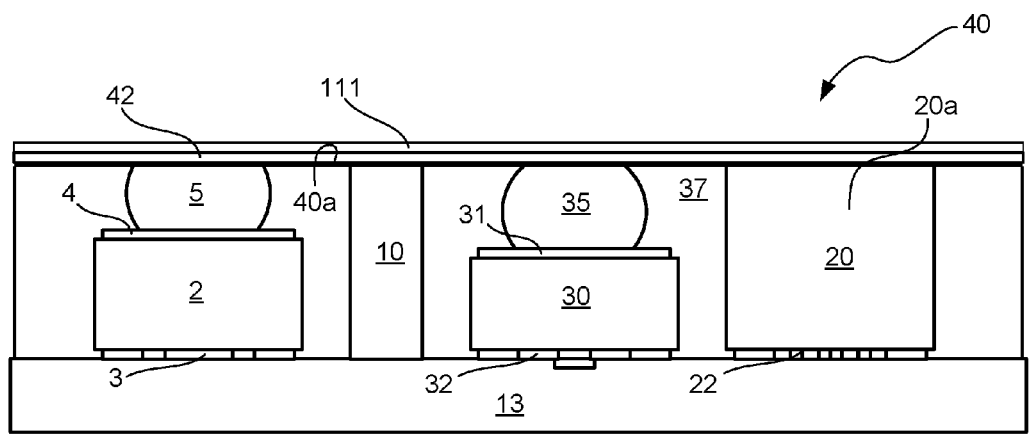
FIG. 4A illustrates a cross-sectional view of the eWLP wafer shown in FIG. 2G with a layer of dielectric material disposed on the back side of the wafer on top of the metal layer.
Figure 4B:
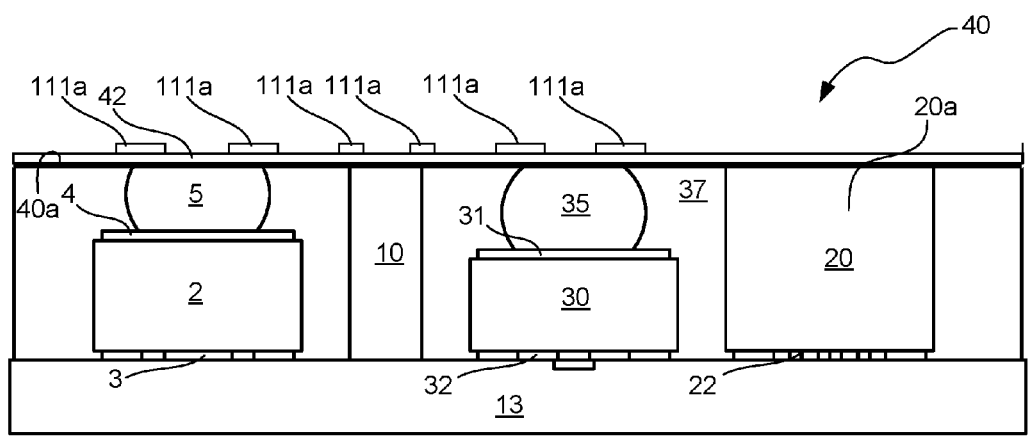
FIG. 4B illustrates a cross-sectional view of the wafer shown in FIG. 4A after it has been subjected to a dielectric layer structuring, or patterning, process to form a patterned dielectric layer on top of the metal layer.
Figure 4C:
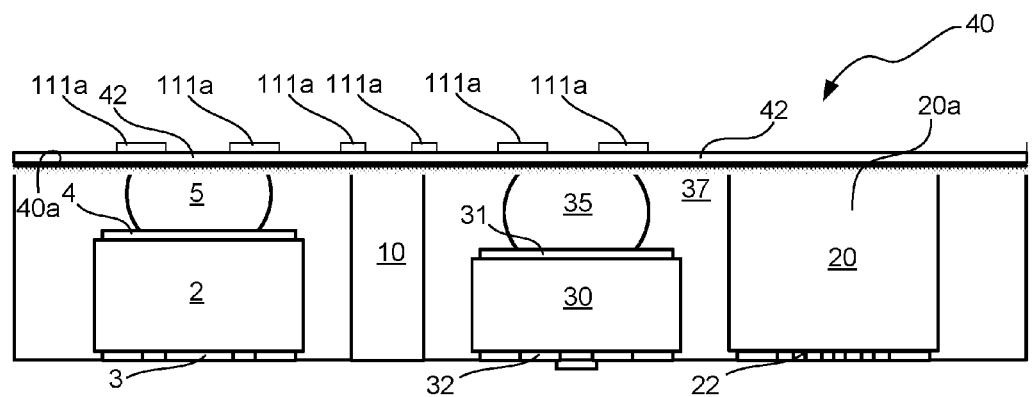
FIG. 4C illustrates a cross-sectional view of the wafer shown in FIG. 4B after the tape base has been removed.

The process described above with reference to FIGS. 2G-2N may be altered to create an eWLP assembly having an optical interface on one side of the assembly and an electrical interface on the opposite side of the assembly, as will now be described with reference to FIGS. 4A-4J. FIG. 2G is shown again in FIG. 4A, but with a layer of dielectric material 111 disposed on the back side of the wafer 40 on top of the metal layer 42. FIG. 4B illustrates a cross-sectional view of the wafer 40 shown in FIG. 4A after it has been subjected to a dielectric layer structuring, or patterning, process to form a patterned dielectric layer 111a on top of the metal layer 42. Known photolithographic techniques or other known wafer processing techniques are used to structure or pattern the dielectric layer 111. After the dielectric layer structuring process has been performed, the adhesive tape base 13 is removed. FIG. 4C illustrates a cross-sectional view of the wafer 40 shown in FIG. 4B after the tape base 13 has been removed.

Figure 4D:
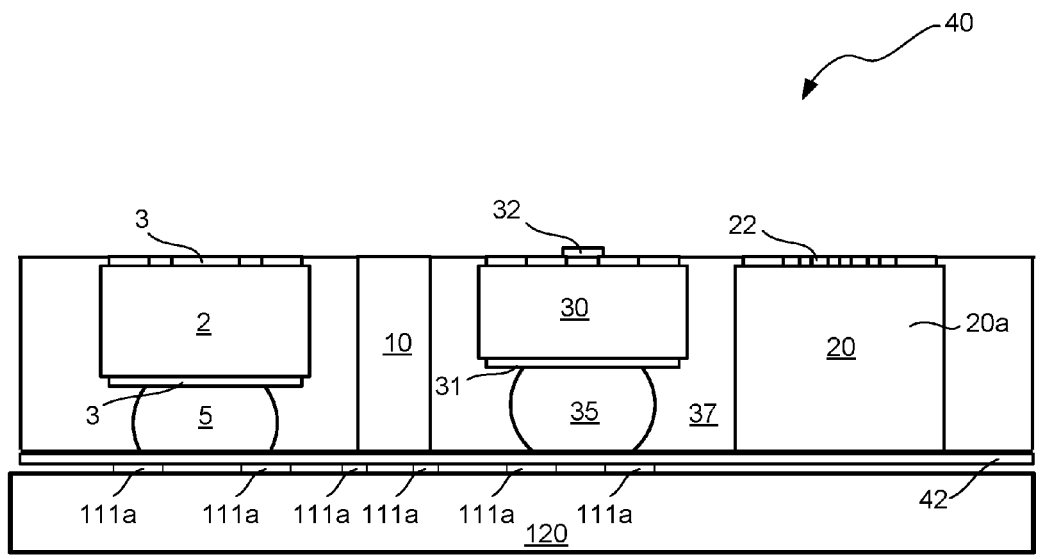
FIG. 4D illustrates a cross-sectional view of the wafer shown in FIG. 4C after the wafer has been flipped and the back side is placed in contact with another adhesive tape base.
Figure 4E:
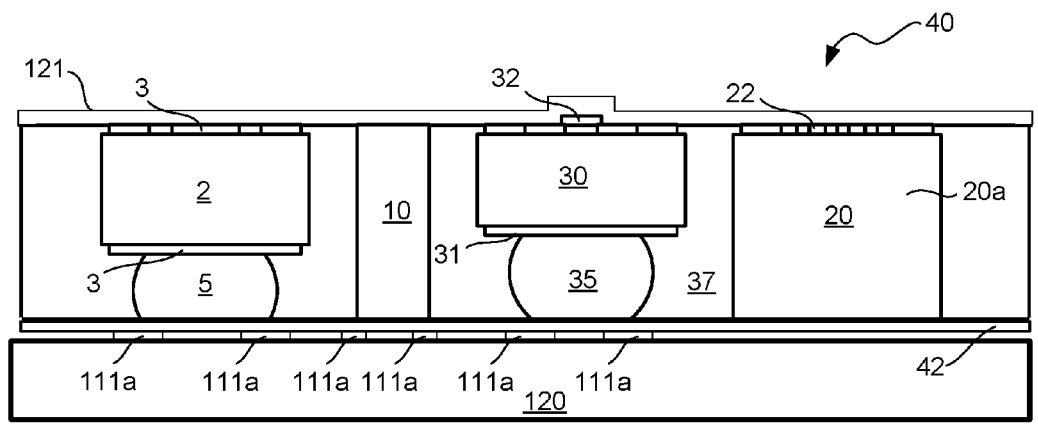
FIG. 4E illustrates a cross-sectional view of the wafer shown in FIG. 4D after it has been subjected to a metal deposition process by which a metal layer is formed on the front side of the wafer.
Figure 4F:
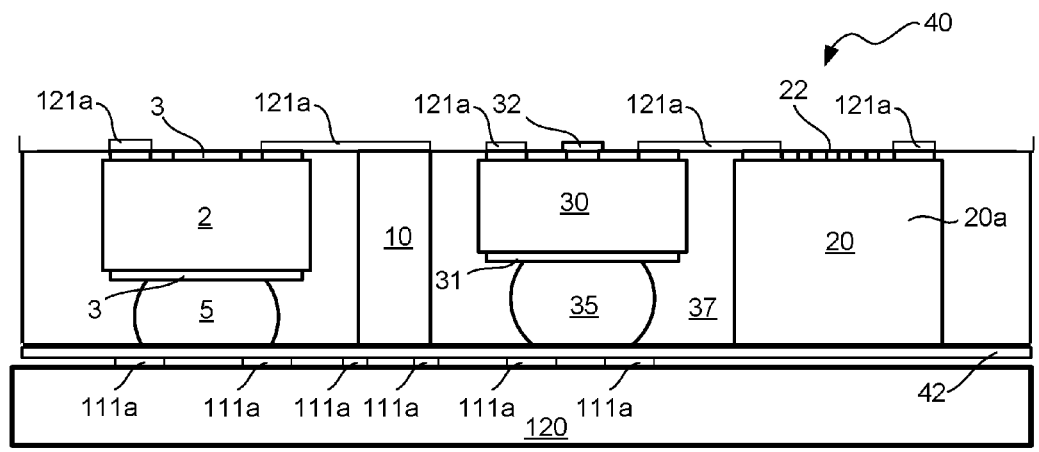
FIG. 4F illustrates a cross-sectional view of the wafer shown in FIG. 4E after it has been subjected to a metal layer structuring, or patterning, process to form a structured metal layer on the front side of the wafer.
Figure 4G:
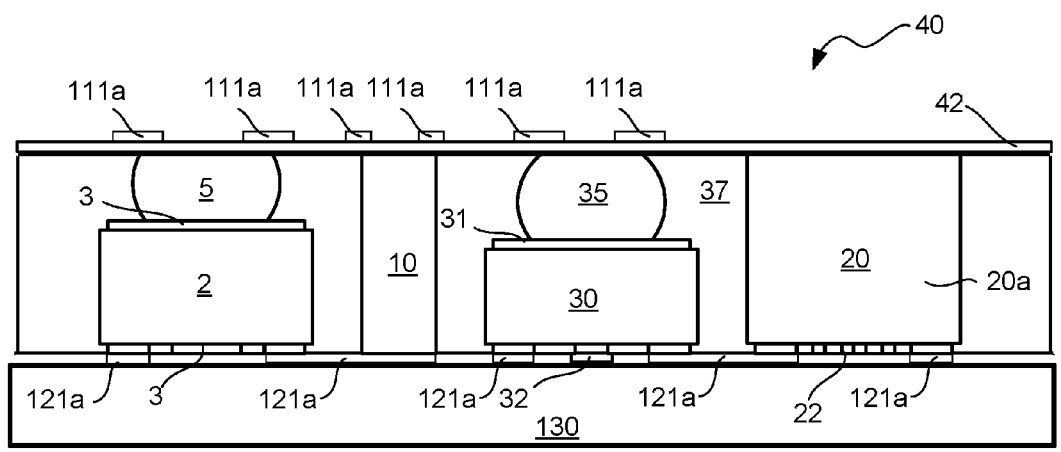
FIG. 4G illustrates a cross-sectional view of the wafer shown in FIG. 4F after the wafer has been flipped and placed on another adhesive tape base.
Figure 4H:
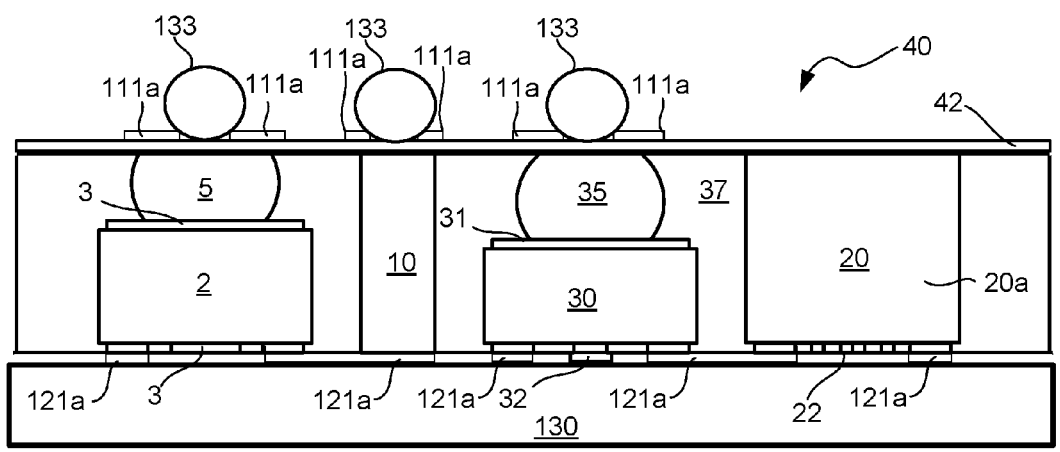
FIG. 4H illustrates a cross-sectional view of the wafer shown in FIG. 4G after electrically-conductive contact elements have been placed on the back side of the wafer.
Figure 4I:
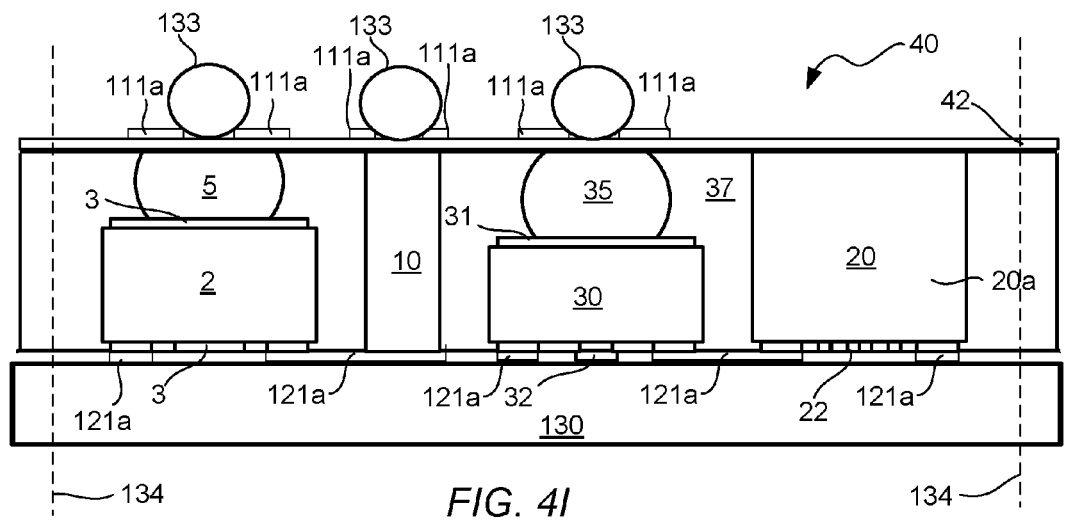
FIG. 4I illustrates a cross-sectional view of the wafer shown in FIG. 4H after it has been singulated into multiple eWLP packages.

After the tape base 13 has been removed, the wafer 40 is flipped and the back side is placed in contact with another adhesive tape base 120 such that the patterned dielectric layer 111a is contact with the adhesive of the tape base 120, as represented by the cross-sectional view of the wafer 40 shown in FIG. 4D. The wafer 40 is then subjected to a metal deposition process by which a metal layer 121 is formed on the front side of the wafer 40, as represented by the cross-sectional view shown in FIG. 4E. A metal layer structuring, or patterning, process is then performed on the wafer 40 to pattern, or structure, the metal layer 121 to form a structured metal layer 121a on the front side of the wafer 40, as represented by the cross-sectional view of the wafer 40 shown in FIG. 4F. The wafer shown in FIG. 4F is then flipped and placed on another adhesive tape base 130, as represented by the cross-sectional view of the wafer 40 shown in FIG. 4G. Electrically-conductive contact elements 133 are then placed on the back side of the wafer 40 where there are openings in the patterned dielectric layer 111a above the contact elements 5, 35 and the top surface of the block of bulk material 10 and in contact with the metal layer 42, as represented by the cross-sectional view of the wafer 40 shown in FIG. 4H. The wafer 40 shown in FIG. 4H is then singulated into multiple eWLP packages, as represented by the dashed lines 134 in the cross-sectional view of the wafer 40 shown in FIG. 4I. The adhesive tape base 130 is then removed, resulting in the finished eWLP package 140 shown in FIG. 4J.

Figure 4J:
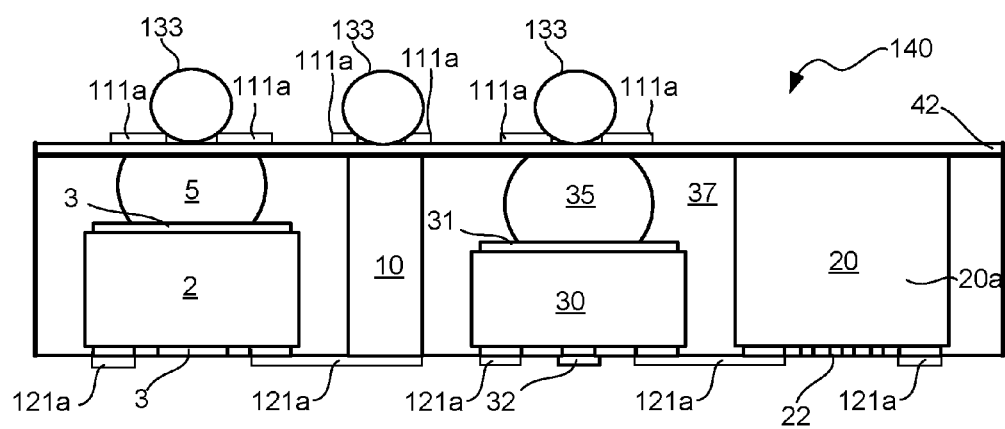
FIG. 4J illustrates a cross-sectional view of the wafer shown in FIG. 4I after the adhesive tape base has been removed.
Figure 5:
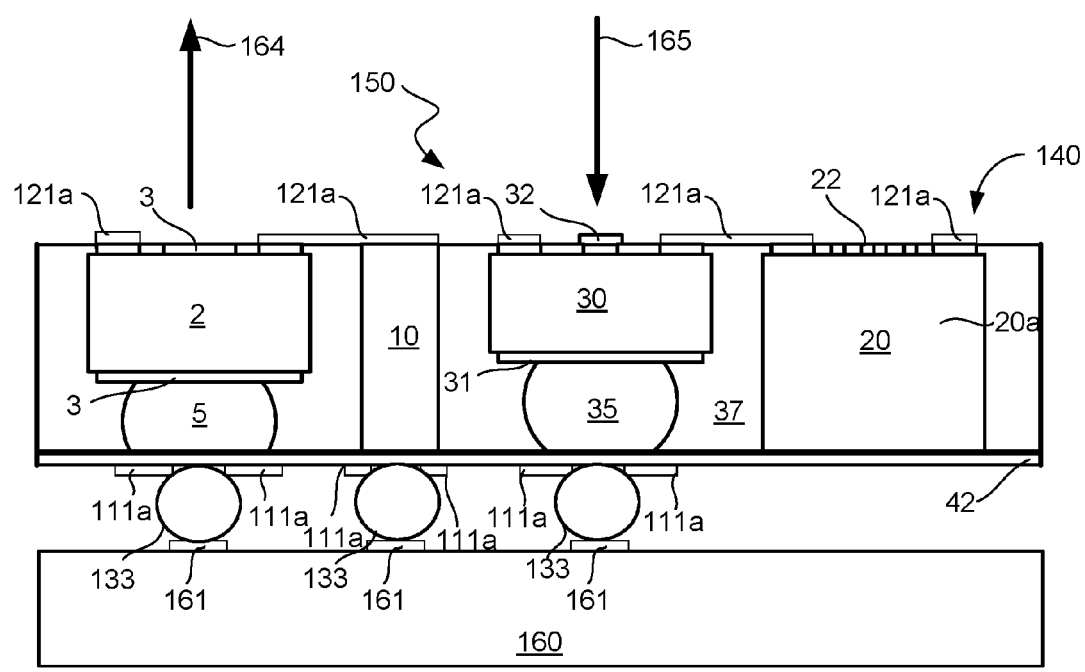
FIG. 5 illustrates a cross-sectional view of an eWLP assembly comprising the eWLP package shown in FIG. 4J flipped and mounted on a PCB.

FIG. 5 illustrates a cross-sectional view of an eWLP assembly 150 comprising the eWLP package 140 shown in FIG. 4J flipped and mounted on a PCB 160 such that the contact elements 133 of the eWLP package 140 are in contact with respective contact elements 161 of the PCB 160. Other mechanisms (not shown) may be used to mechanically couple the PCB 160 with the eWLP package 140 and to provide mechanical stability for the assembly 150. No optical windows are needed in the PCB 160 because the optical interface is on the side of the assembly 150 opposite the PCB 160. In accordance with this illustrative embodiment, the chip 2 is an optoelectronic receiver chip, such as, for example, a photodiode chip, and the chip 30 is an optoelectronic transmitter chip, such as, for example, an LED chip or a laser diode chip. Thus, in accordance with this illustrative embodiment, the arrow 164 represents light impinging on a light-receiving area of the chip 2 and the arrow 165 represents light emitted from the chip 30. The chip 20 may be, for example, a receiver chip for processing electrical sense signals produced by the chip 2, a laser diode driver chip for producing electrical drive signals that drive the chip 30, or a combination of the two.

It can be seen from FIG. 5 that the eWLP assembly 150 has an optical interface at one side of the assembly 150 and an electrical interface with the PCB 160 at the opposite side of the assembly 150. If desired or needed, electrical contact between the PCB 160 and the electrical contacts 3, 22 and 32 located on the front sides of the chips 2, 20 and 30, respectively, may be made via contact elements 161 and 133 that are electrically coupled to the bulk material block 10, via the metal layer 42, via the bulk material block 10, via the bulk material 20a of chip 20, and via the patterned metal layer 121a. As indicated above, the bulk material of the block 10 has an electrical conductivity that is sufficiently high to allow it to be used as an electrical pathway. In accordance with this illustrative, the bulk material 20a of chip 20 has an electrical conductivity that is sufficiently high to allow it to be used as an electrical pathway. Of course, electrical contact between the PCB 160 and the electrical contacts 3, 22 and 32 may be accomplished in other ways. In addition, further processing of the eWLP package 140 can be performed to form a redistribution layer in the patterned metal layer 121a to further facilitate electrically interfacing the contacts 3, 22, and 32 of the chips 2, 20 and 30, respectively, to other devices (not shown).

The wafer-level processes described above with reference to FIGS. 1A-4J, and variations thereof, may be used to create a number of useful optoelectronic eWLP assemblies while making it easier and more cost effective to make electrical connections to the back side of eWLP packages at the eWLP wafer level. Various examples of such assemblies will now be described with reference to FIGS. 6-9.

Figure 6:
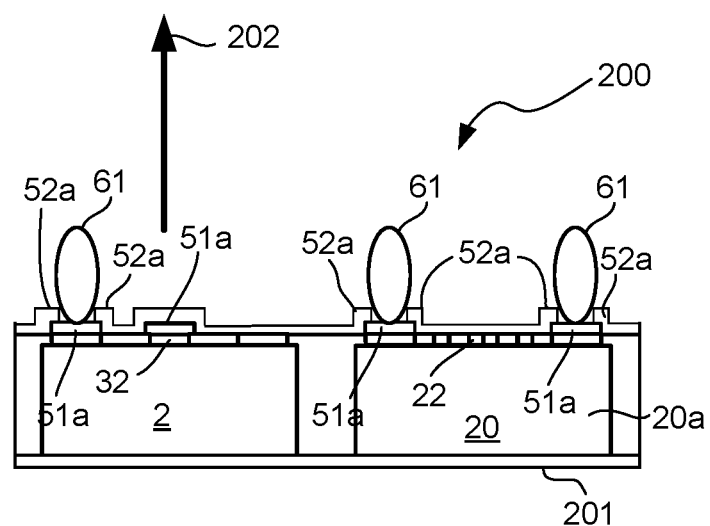
FIG. 6 illustrates a cross-sectional view of an example of an optoelectronic eWLP package in accordance with an illustrative embodiment.

FIG. 6 illustrates a cross-sectional view of an example of an eWLP package 200 that is similar to the eWLP package 60 shown in FIG. 2N except that chip 30, the block of bulk material 10 and the associated elements shown in FIG. 2N have been eliminated. In accordance with this embodiment, the chips 2 and 20 are an LED chip and an LED driver chip, respectively. The package 200 is formed by processes similar to those described above with reference to FIGS. 1A-2M, except that some of those process steps have been skipped. For example, the process steps of adding the metallization layer 4 and the contact elements 5 in FIGS. 1A and 1B, respectively, have been skipped because they are not needed. The back side of the package 200 has a metal layer 201 thereon that is added during the eWLP wafer-level process, after the eWLP wafer has been ground down. The metal layer 201 interconnects electrical contacts (not shown) disposed on the back sides of the chips 2 and 20. Thus, the back side electrical contacts of the chips 2 and 20 are at the same electrical potential. In the bulk material 20a of chip 20, p-type or n-type wells electrically isolate the functional structures 22 of chip 20 from the back side electrical contact of chip 20. The arrow 202 represents light emitted by the LED chip 2.

The configuration shown in FIG. 6 is advantageous because LED chips often have one front side electrical contact and one back side electrical contact. Another advantage of the configuration shown in FIG. 6 is that a heat sink device (not shown) may be secured to the metal layer 201 to allow heat generated by the chips 2 and 20 to be dissipated through the back side of the package 200.

Figure 7:
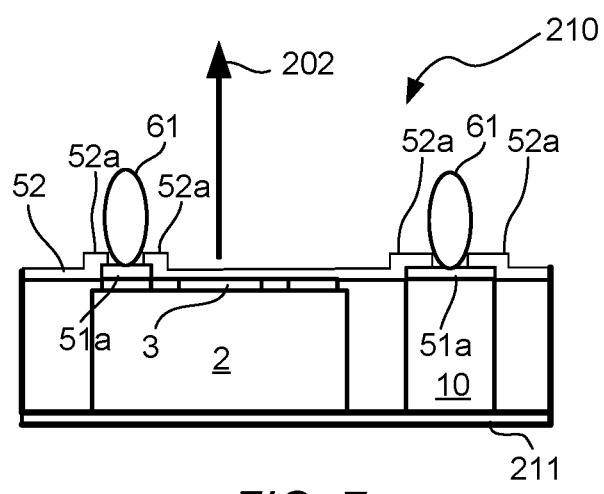
FIG. 7 illustrates a cross-sectional view of an example of an optoelectronic eWLP package in accordance with an illustrative embodiment.

FIG. 7 illustrates a cross-sectional view of an example of an eWLP package 210 that is similar to the eWLP package 60 shown in FIG. 2N except that chips 20 and 30 and the associated elements shown in FIG. 2N have been eliminated. In accordance with this embodiment, the chip 2 is an LED chip driven by external LED driver circuitry (not shown). The package 210 is formed by processes similar to those described above with reference to FIGS. 1A-2M, except that some of those process steps have been skipped. The back side of the package 210 has a metal layer 211 thereon that interconnects electrical contacts (not shown) disposed on the back sides of the chip 2 with the bulk material 20a of the block of bulk material 20. The bulk material (e.g., silicon) of block 10 is sufficiently electrically conductive to conduct enough electrical current to drive the LED chip 2. The external LED driver circuitry is connected to the electrical contact element 61 disposed above the block 10. The block 10 conducts the electrical drive current to the back side of the package 210 into the metal layer 211, which is connected to the back side electrical contact (not shown) of the chip 2. In this way, the external LED driver circuitry drives the LED chip 2. The arrow 212 represents light emitted by the LED chip 2.

As with the eWLP package 200 shown in FIG. 6, the eWLP package 210 shown in FIG. 7 allows an electrical connection to be easily and economically made to the back side electrical contact of the LED chip 2. As with the package 200 shown in FIG. 6, a heat sink device (not shown) may be secured to the metal layer 211 of the package 210 to allow heat generated by the chip 2 and block 10 to be dissipated through the back side of the package 210.

Figure 8:
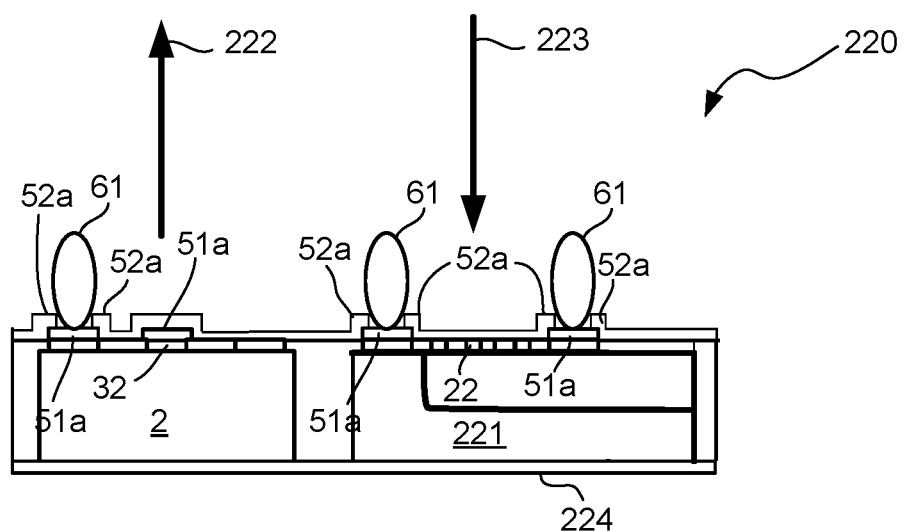
FIG. 8 illustrates a cross-sectional view of an example of an optoelectronic eWLP package in accordance with an illustrative embodiment.

FIG. 8 illustrates a cross-sectional view of an example of an eWLP package 220 that is similar to the eWLP package 200 shown in FIG. 6 except that chip 20 has been replaced by chip 221, which is a combined LED driver and photodiode chip. Thus, chip 221 is both an optoelectronic receiver chip, including an integrated photodiode and amplifier, and an LED driver chip. The arrow 222 represents light emitted by the LED chip 2. The arrow 223 represents light received by the photodiode/LED driver chip 221. The metal layer 224 disposed on the back side of the package 220 interconnects electrical contacts (not shown) disposed on the back sides of the chips 2 and 221.

As with the eWLP package 200 and 210 shown in FIGS. 6 and 7, the eWLP package 220 shown in FIG. 8 allows an electrical connection to be easily and economically made to the back side electrical contacts of the LED chip 2 and of the photodiode/LED driver chip 221. As with the packages 200 and 210 shown in FIGS. 6 and 7, a heat sink device (not shown) may be secured to the metal layer 224 of the package 220 to allow heat generated by the chips 2 and 221 to be dissipated through the back side of the package 220.

Figure 9:
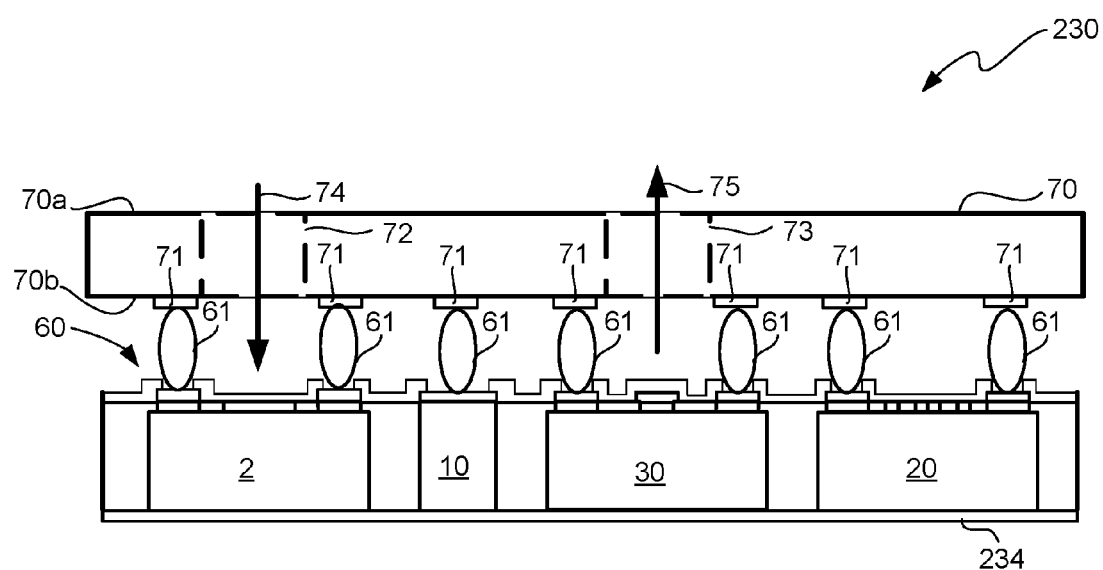
FIG. 9 illustrates a cross-sectional view of an example of an optoelectronic eWLP package in accordance with an illustrative embodiment.

FIG. 9 illustrates a cross-sectional view of an example of an eWLP package 230 that is similar to the eWLP package 100 shown in FIG. 3 except that the contact elements 5 and 35 and the metallization layers 4 and 31 are not part of the package 230, either because they were never included or because the back side of the eWLP wafer has been grinded down to the point that they have been eliminated. A metal layer 234 disposed on the back side of the package 230 is in contact with any electrical contacts disposed on the back sides of the chips 2, 20 and/or 30. The bulk material of block 10 and of chip 20 provide electrically-conductive pathways from the front side of the package 230 to the metal layer 234.

Not all chips have back side electrical contacts, so it is not necessary in all cases to provide electrically-conductive pathways from the front side of the eWLP package to the back side of the eWLP package. The above examples demonstrate the manner in which such electrically-conductive pathways can be easily and economically provided at the eWLP wafer level in the event that they are needed or desired. In addition, the above examples demonstrate how such pathways can be provided without having to form TSVs or TMVs in the chips or in the eWLP wafer, respectively. It should be noted that the examples are not exhaustive and that persons of skill in the art will understand, in view of the description being provided herein, the manner in which the principles and concepts described herein can be applied to create other types of eWLP devices, packages and assemblies.

It should also be noted that the electrically-conductive contact elements described above may also serve as thermally-conductive contact elements for helping conduct heat away from the chips. Also, there may be cases in which the contact elements serve only as thermally-conductive contact elements. In such cases, the contact elements are placed in contact with an external heat sink device, such as a copper heat spreader device, for example, which dissipates heat transferred into it from the contact elements. For example, with reference to FIG. 5, if chip 2 does not have a back side electrical contact, then the contact element 133 that is electrically coupled with contact element 5 may be used to transfer heat away from the chip 2 via contact elements 5 and 161.

It should be noted that the invention has been described with reference to a few illustrative embodiments for the purpose of demonstrating the principles and concepts of the invention. It will be understood by persons of skill in the art, in view of the description provided herein, that the invention is not limited to these illustrative embodiments. For example, the invention has been described with respect to examples of particular configurations of eWLP devices made using methods of the invention, but the invention is not limited with respect to the particular configurations of the eWLP devices. The invention also is not limited to the particular sequences of process steps described above with reference to the figures. Persons of skill in the art will understand that many variations can be made to the illustrative embodiments without deviating from the scope of the invention.

What is claimed is:

1. An embedded Wafer-Level Packaging (eWLP) package comprising:
   at least first and second chips encapsulated inside of a molded material, the molded material having a front side and a back side, the front side of the molded material being co-planar with respective front sides of the first and second chips, a back side of the molded material being parallel to the front side of the molded material, the first and second chips having respective first electrical contacts disposed on respective front sides of the first and second chips and exposed thru the front side of the molded material, the first chip having at least one second electrical contact disposed on a back side of the first chip; and
   a metal layer disposed on the back side of the molded material, the second electrical contact disposed on the back side of the first chip being electrically coupled to the metal layer, the back side of the second chip being in contact with the metal layer, and wherein the second chip comprises a bulk material having a predetermined electrical conductivity that is sufficiently high for conducting electrical current from the first electrical contact disposed on the front side of the second chip to the back side of the second chip.

2. The eWLP package of claim 1, wherein the first chip is an electrical-to-optical converter (EO) chip for converting an electrical signal into an optical signal and wherein the second chip comprises a combination of an EO driver for driving the EO chip and an optical-to-electrical (OE) converter for converting an optical signal received by the second chip into an electrical signal.

3. The eWLP package of claim 2, wherein the EO chip is a light-emitting diode (LED) chip, the EO driver is an LED driver and the OE converter is a photodiode.

4. The eWLP package of claim 2, wherein the EO chip is a laser diode chip, the EO driver is a laser diode driver and the OE converter is a photodiode.

5. The eWLP package of claim 1, wherein a purpose of the second chip is to conduct electrical current from the first electrical contact disposed on the front side of the second chip to the back side of the second chip such that an electrical connection is made via the second chip and the metal layer to said at least one second electrical contact disposed on the back side of the first chip.

6. The eWLP package of claim 1, further comprising:
   at least a third chip encapsulated inside of the molded material such that the front side of the molded material is co-planar with a front side of the third chip, the third chip having at least one first electrical contact disposed on the front side thereof and exposed thru the front side of the molded material, the third chip having at least one second electrical contact disposed on a back side of the third chip, and wherein the metal layer disposed on the back side of the molded material is electrically coupled to the second electrical contact disposed on the back side of the third chip.

7. The eWLP package of claim 6, wherein a purpose of the second chip is to conduct electrical current from the first electrical contact disposed on the front side of the second chip to the back side of the second chip such that an electrical connection is made via the second chip and the metal layer to said at least one second electrical contact disposed on the back side of the first chip.

8. The eWLP package of claim 7, wherein the first chip is an optical-to-electrical (OE) converter chip for converting an optical signal into an electrical signal, and wherein the third chip is a receiver chip for processing the electrical signal.

9. The eWLP package of claim 7, wherein the first chip is an electrical-to-optical (EO) converter chip for converting an electrical signal into an optical signal.

10. The eWLP package of claim 9, wherein the EO converter chip is a light-emitting diode (LED) chip.

11. The eWLP package of claim 10, wherein the third chip is an LED driver chip.

12. The eWLP package of claim 9, wherein the EO converter chip is a laser diode chip.

13. The eWLP package of claim 12, wherein the third chip is a laser diode driver chip.

14. The eWLP package of claim 9, wherein the third chip is an optical-to-electrical (OE) converter chip that converts an optical signal received by the OE converter chip into an electrical signal.

15. The eWLP package of claim 14, wherein the OE converter chip is a photodiode chip.

16. The eWLP package of claim 14, wherein the second chip is a receiver chip for processing the electrical signal.

17. An embedded Wafer-Level Packaging (eWLP) package comprising:
- at least first, second and third chips encapsulated inside of a molded material, the molded material having a front side and a back side, the front side of the molded material being co-planar with respective front sides of the first, second and third chips, a back side of the molded material being parallel to the front side of the molded material, the first, second and third chips having respective first electrical contacts disposed on respective front sides of the first, second and third chips and exposed thru the front side of the molded material, the first and third chips each having at least one second electrical contact disposed on a back side of the first and third chips; and
- a metal layer disposed on the back side of the molded material, the second electrical contacts disposed on the back sides of the first and third chips being electrically coupled to the metal layer, the back side of the second chip being in contact with the metal layer, and wherein the second chip comprises a bulk material having a predetermined electrical conductivity that is sufficiently high for conducting electrical current from the first electrical contact disposed on the front side of the second chip to the back side of the second chip, and wherein a purpose of the second chip is to conduct electrical current from the first electrical contact disposed on the front side of the second chip to the back side of the second chip such that an electrical connection is made via the second chip and the metal layer to said at least one second electrical contact disposed on the back side of the first chip.

18. The eWLP package of claim 17, wherein the first chip is an optical-to-electrical (OE) converter chip for converting an optical signal into an electrical signal, and wherein the third chip is a receiver chip for processing the electrical signal.

19. The eWLP package of claim 17, wherein the first chip is an electrical-to-optical (EO) converter chip for converting an electrical signal into an optical signal.

20. The eWLP package of claim 19, wherein the third chip is an optical-to-electrical (OE) converter chip that converts an optical signal received by the OE converter chip into an electrical signal.

21. An embedded Wafer-Level Packaging (eWLP) assembly comprising:
- a circuit board (CB) having a plurality of electrical contacts disposed on a first surface thereof;
- an eWLP package comprising:
  - at least first and second chips encapsulated inside of a molded material, the molded material having a front side and a back side, the front side of the molded material being co-planar with respective front sides of the first and second chips, a back side of the molded material being parallel to the front side of the molded material, the first and second chips having respective first electrical contacts disposed on respective front sides of the first and second chips and exposed thru the front side of the molded material, the first chip having at least one second electrical contact disposed on a back side of the first chip, and
  - a metal layer disposed on the back side of the molded material, the second electrical contact disposed on the back side of the first chip being electrically coupled to the metal layer, the back side of the second chip being in contact with the metal layer, and wherein the second chip comprises a bulk material having a predetermined electrical conductivity that is sufficiently high for conducting electrical current from the first electrical contact disposed on the front side of the second chip to the back side of the second chip;
and
- a plurality of electrically-conductive contact elements, each electrically conductive contact element interconnecting one of the first electrical contacts disposed on the front sides of the first and second chips and one of the electrical contacts disposed on the first surface of the CB.

* * * * *